United States Patent
Humphrey et al.

(10) Patent No.: US 6,573,766 B1
(45) Date of Patent: Jun. 3, 2003

(54) SYNTHESIZING A SINE WAVE

(75) Inventors: Francis Alan Humphrey, Leics (GB); David Byrne, Leics (GB); Barry Leonard Price, Leics (GB)

(73) Assignee: Lattice Intellectual Property Ltd., London (GB)

( * ) Notice: Subject to any disclaimer, the term of this patent is extended or adjusted under 35 U.S.C. 154(b) by 0 days.

(21) Appl. No.: 09/720,025

(22) PCT Filed: Jun. 17, 1999

(86) PCT No.: PCT/GB99/01932

§ 371 (c)(1),
(2), (4) Date: Feb. 15, 2001

(87) PCT Pub. No.: WO99/67877

PCT Pub. Date: Dec. 29, 1999

(30) Foreign Application Priority Data

Jun. 24, 1998 (GB) .............................................. 9813513

(51) Int. Cl.⁷ .................................................. H03K 4/94
(52) U.S. Cl. ........................ 327/129; 327/299; 327/361
(58) Field of Search ................................ 327/129, 298, 327/299, 352, 361, 32, 35, 38; 331/45, 37, 38, 41, 172; 363/148, 149; 455/313, 314

(56) References Cited

U.S. PATENT DOCUMENTS

| 3,801,807 A | * | 4/1974 | Condon ....................... 327/129 |
| 3,995,222 A | * | 11/1976 | Mitarai ........................ 327/129 |
| 4,481,489 A | * | 11/1984 | Kurby .......................... 331/23 |
| 5,389,897 A | * | 2/1995 | Gebara .......................... 331/1 |
| 5,521,556 A | * | 5/1996 | O'Shaughnessy et al. .. 331/1 R |
| 6,323,739 B1 | * | 11/2001 | Andrews ................. 331/117 R |

FOREIGN PATENT DOCUMENTS

GB      2062990      *  5/1981

* cited by examiner

Primary Examiner—Timothy P. Callahan
Assistant Examiner—An T. Luu
(74) Attorney, Agent, or Firm—William H. Holt

(57) ABSTRACT

A method and apparatus for synthesizing an approximation to a sine wave comprising generating a number of pulse width modulated signals, each having a predetermine duty cycle and being the same frequency as each other, from a clock signal. The generated pulse width modulated signals are then combined to produce an approximation to a sine wave having the same frequency as the pulse width modulated signals. The clock signal is provided by an oscillator arranged to produce clock signals over a continuous range of frequencies so that approximations to a sine wave can be produced over a continuous range of frequencies.

12 Claims, 8 Drawing Sheets

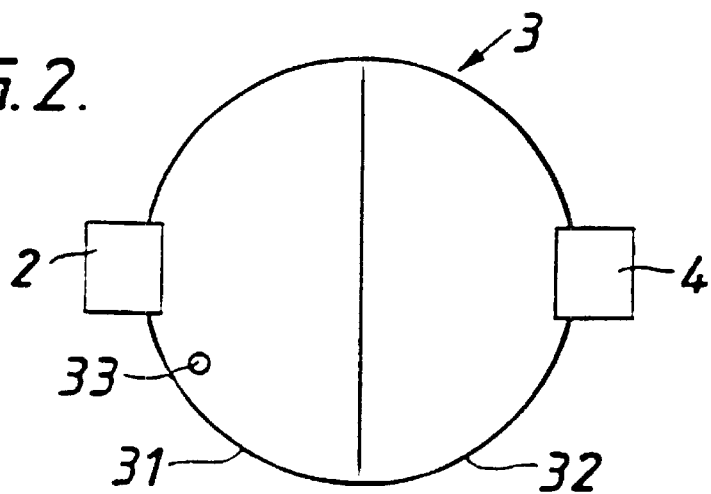
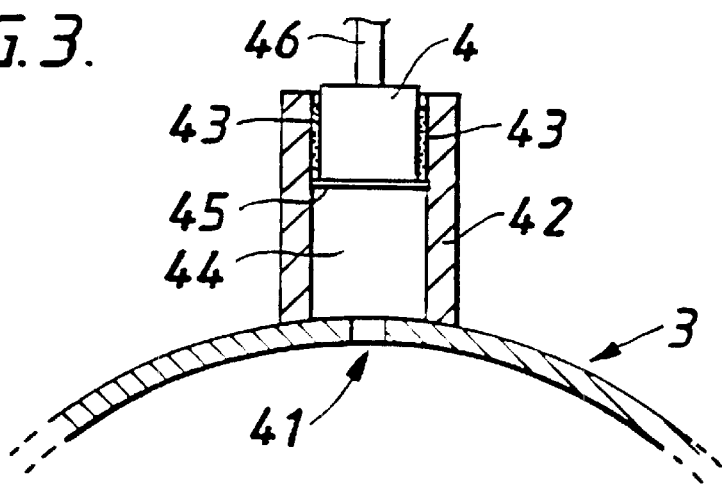
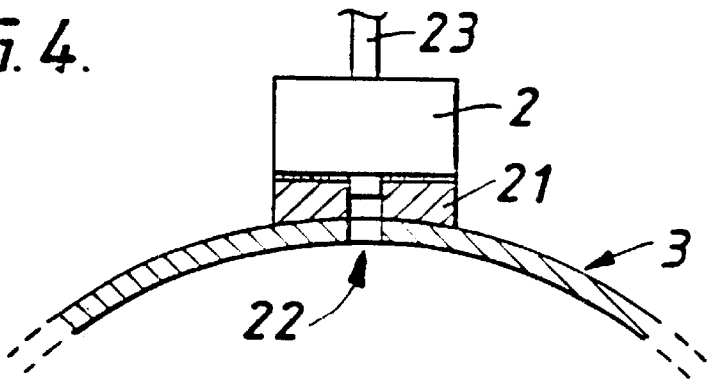

SYNTHESIZING A SINE WAVE

The present invention relates to a method and apparatus for synthesising approximations to sine waves over a range of frequencies.

As shown in FIG. 6, an approximation to a sine wave 105 may be generated from a conveniently compact device by combining a number of pulse width modulated signals 102,103,104 generated by a microprocessor from its own clock signal 101. In order to produce a sine wave 105 having a different frequency, the frequency of the clock signal 101 is divided by a number such as 1,2,3,4 . . . etc. However, this produces discrete coarse steps in the resultant range of sine wave frequencies produced. For example if the clock signal in FIG. 6 has a frequency of 16 MHz, as may be used with a microprocessor, the highest sine wave frequency that can be synthesised in this example is 1 MHz, as sixteen clock cycles are needed to synthesise each sine wave cycle. The next highest sine wave frequency available is achieved by halving the clock frequency to 8 MHz producing a sine wave of 500 kHz. The next highest sine wave frequency is achieved by dividing the clock frequency by three to give a frequency of 5.3 MHz producing a resultant sine wave frequency of 330 kHz and so on.

As can be seen, large discrete steps or poor frequency resolution is produced in the resultant range of sine wave frequencies available.

According to a first aspect of the present invention an apparatus for synthesising an approximation to a sine wave comprises:

means for generating a number of pulse width modulated signals from a clock signal; and means for combining the generated pulse width modulated signals to produce an approximation to a sine wave;

wherein the clock signal is provided by an oscillator arranged to produce clock signals over a continuous range of frequencies.

According to a further aspect of the present invention a method of synthesising an approximation to a sine wave comprises:

generating a number of pulse width modulated signals from a clock signal; and combining the generated pulse width modulated signals to produce an approximation to a sine wave;

wherein the clock signal is provided by an oscillator arranged to produce clock signals over a continuous range of frequencies.

The use of the oscillator to produce clock signals over a continuous range of frequencies enables the production of resultant sine waves with a continuous range of frequencies rather than the discrete range discussed above.

The oscillator preferably produces a variation in its output clock signal frequency as a result of a variation in an input controlling electrical signal. The input controlling electrical signal that is varied is preferably a voltage making the oscillator a voltage controlled oscillator.

The output frequency of the oscillator and also of the approximation to a sine wave can thus be controlled by simply varying an input signal to the oscillator.

The approximation to a sine wave may be "smoothed" to remove at least some of the high frequency components by passing the signal through a low pass filter.

The sine wave produced may be used in a number of applications such as to match the frequency of the produced sine wave with the frequency of another detected signal or to provide stimulation which produces a particular effect at a particular unknown frequency which is then detected. In such applications it would be desirable to be able to determine the particular frequency which, in the above examples matches the detected frequency or produces the particular effect. The frequency need not necessarily be consistently related to the controlling input signal applied to the oscillator but may be variable due to, for example temperature changes.

To accurately determine a particular frequency of a synthesised approximation to a sine wave, the number of cycles of one of the pulse width modulated signals or the clock signal produced over a given period of time such as one second may be counted and/or the time taken to produce a fixed number of cycles may be measured and from this the frequency determined.

The means for generating pulse width modulated signals from a clock signal is preferably a processing means.

The invention is described further by way of example with reference to the accompanying drawings in which:

FIG. 2 shows a substantially spherical resonator that can be used in the system;

FIG. 3 shows how the acoustic receiver is mounted to the resonator;

FIG. 4 shows how the acoustic transmitter is mounted to the resonator;

Figure 1:
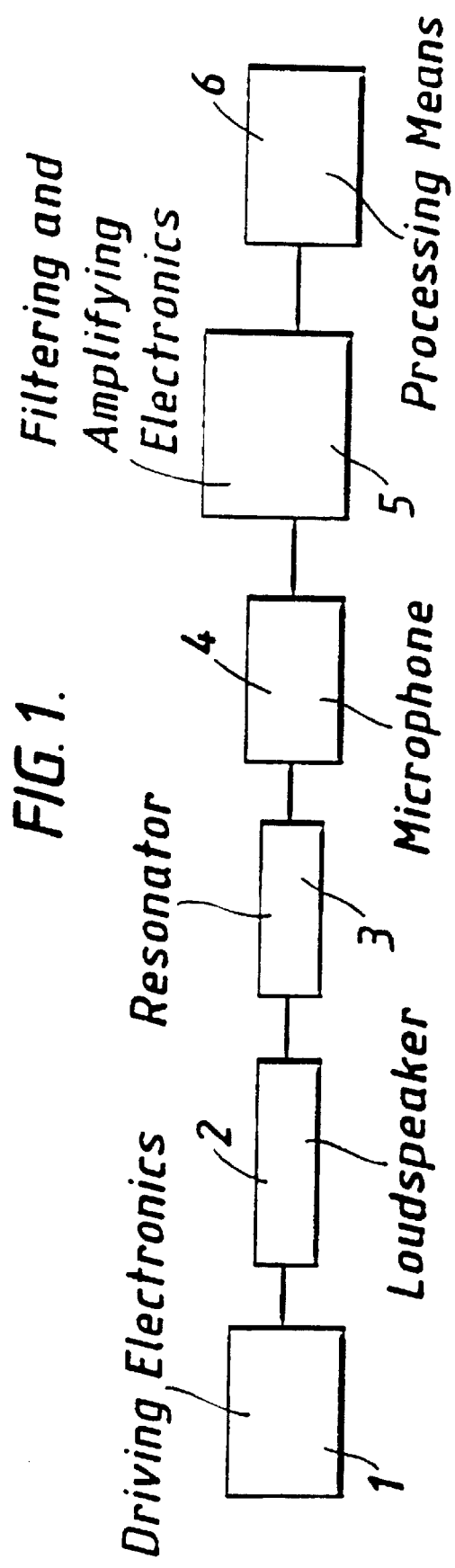
FIG. 1 is a block diagram illustrating the overall operation of a system to measure the speed of sound of a gas using a resonator.

As shown by FIG. 1, driving electronic circuit 1 which may include or be in the form of a microprocessor is arranged to produce a sinusoidal signal over a suitable range of frequencies to drive a loudspeaker 2. The loudspeaker is arranged to apply an acoustic signal to the interior of a resonator 3. Microphone 4 is arranged to pick up the magnitude of the acoustic signal within the resonator. The signal from the microphone is filtered and amplified by an appropriate electronic circuit 5 and a processing means 6 determines the resonant frequency relating to the gas within the resonator to determine its speed of sound.

The resonator 3 shown in FIG. 2 is in this case a rigid sphere. The illustrated resonator is formed from two CNC (computer numerically controlled) machined metal hemispheres 31,32, in this case made of copper, of internal radius 1.5 cm and 3 mm wall thickness welded together to form the sphere.

The apexes of hemispheres 31,32 support the loudspeaker 2 and microphone 4 respectively which when the hemispheres are joined as shown in FIG. 2 are substantially 180° apart to provide the largest amplitude microphone signal.

The resonator is provided with a number of gas diffusion passages 33, only one of which is shown in FIG. 2, to enable gas to diffuse in and out of the resonator 3. Each hemisphere 31, 32 is preferably provided with four gas diffusion passages 33 positioned 90° apart. Gas diffusion passages 33 are preferably drilled through the resonator housing and any swarf removed to present a regular repeatable surface to the inside of the resonator.

Alternatively the resonating sphere could be made from a porous material such as a sintered material. Gas diffusion holes 33 shown in the copper resonating sphere of FIG. 2 would then not be required and so would reduce perturbations in the resonant frequency due to the holes 33. The porous material used would preferably have a lower thermal expansion than copper, reducing the amount of correction required for variation in the size of the resonator with ambient temperature changes.

The loudspeaker 2 is in this case a miniature loudspeaker as may be used in a hearing aid with a supply voltage of 5V and a power level of approximately 33 mW and the microphone 4 is a sub-miniature microphone.

FIG. 3 shows how the microphone 4 is mounted to the resonator 3. The resonator is provided with a passage 41 of approximately 1.5 mm diameter which is preferably drilled and any swarf removed. A cylindrical spindle 42 is mounted to or formed as part of the outside of the resonator and arranged concentrically with the passage 41. The spindle 42 is preferably approximately 10 mm in length and has an inner diameter sufficient to accommodate the microphone 4, in this case approximately 5 mm. The position of the microphone 4 within the spindle is variable along its length so that it may be positioned at the optimum point at which the sharpest output signal peak is produced, when the loudspeaker applies the resonant frequency to the resonator. The microphone 4 is secured at the optimum position within the spindle 42 using adhesive 43. The adhesive is preferably prevented from entering the resonator cavity as it could dry in irregular shapes which may cause perturbations in the resonant frequency. The microphone 4 is preferably provided with a rim 45, the outside diameter of which is substantially the same as the inside diameter of the spindle 42 to prevent any adhesive entering the resonator. Alternatively the microphone 4 could fit tightly in the spindle 42. The microphone 4 is connected to the driving electronics 1 by an electrical connection 46.

The loudspeaker 2 may be mounted in the same manner as the microphone 4 shown in FIG. 3, but is in this example fixed at a particular distance from the inside of the resonator as shown in FIG. 4.

In FIG. 4 a spindle 21 of approximately 2 mm length is mounted to or formed as part of the outside wall of the resonator 3 and a 1.5 mm passage 22 drilled through the spindle 21 and the resonator wall with any swarf removed. The loudspeaker 2 is mounted to the outside of the spindle 21 covering the passage 22. The loudspeaker is secured to the spindle 21 using adhesive, ensuring that no adhesive enters passage 22 and is electrically connected to filtering and amplifying electronics 5 by electrical connection 23.

The position of both the microphone and loudspeaker may be variable to attain the sharpest output peak or alternatively either the microphone or loudspeaker may be fixed with the position of the other being variable.

Because of slight variations in each resonating sphere due to machining tolerances for example producing different effective radii, each resonator is calibrated individually using the expression:

$$c = f \times K$$

Each resonator is calibrated using a gas of known speed of sound (c) found using a computer model for predicting gas characteristics such as GASVLE or by measurement using some suitable method. The resonant frequency (f) is then measured for the gas of known speed of sound in the resonator being calibrated and the constant K found. Using the calibrated resonator together with its associated constant K allows the speed of sound to be determined for any gas from the measured resonant frequency. This gives accuracies of about 0.1%. By compensating for variations in ambient temperature affecting the volume of the resonator, the speed of sound of a gas may be determined to even better accuracies of about 0.05%.

Figure 5:
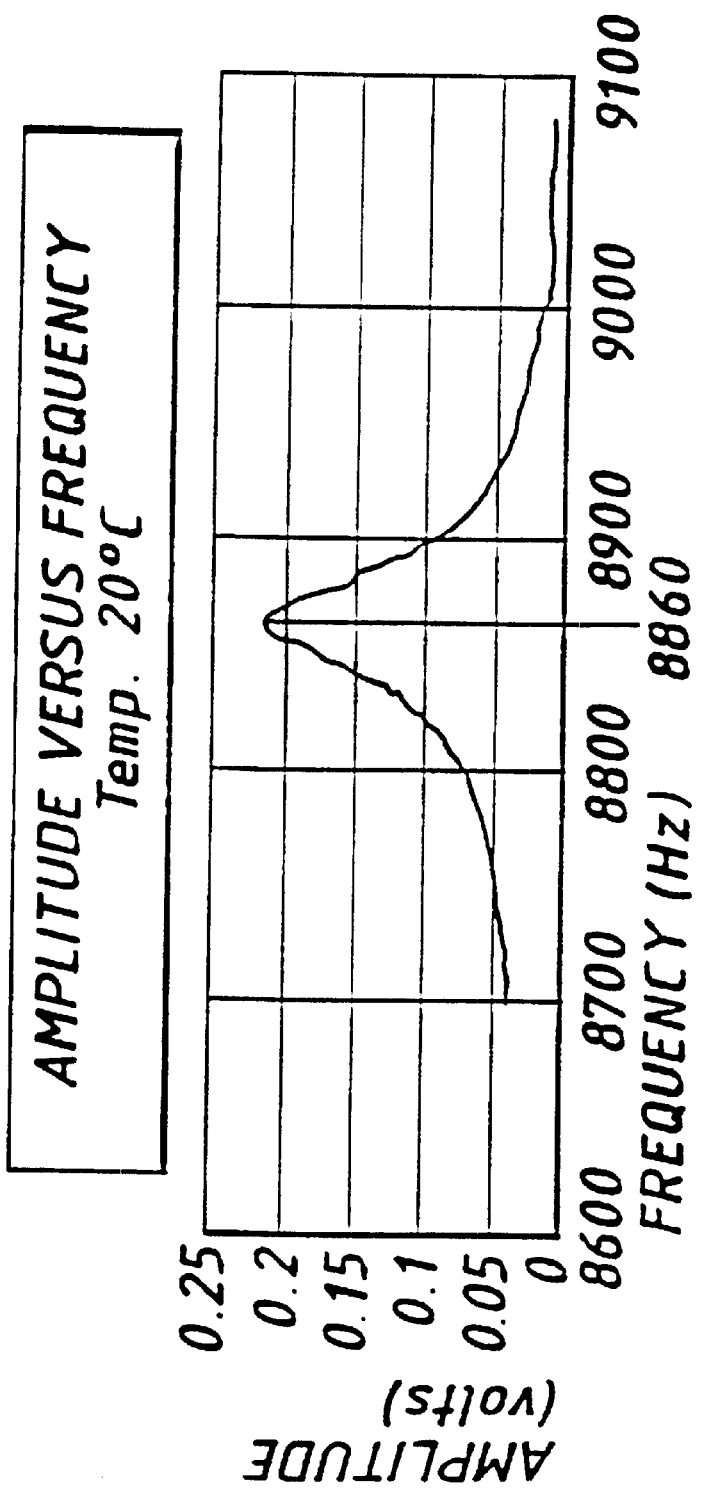
FIG. 5 shows the amplitude of a signal detected by the acoustic receiver over a range of frequencies.

The loudspeaker is driven by an electronic circuit 1 shown diagrammatically in FIG. 1 to provide sinusoidal signals over a frequency range suitable to encompass the frequency of the first non-radial resonance peak of the resonator 3. The loudspeaker is driven in frequency sweeps. The microphone provides an output voltage, which is filtered and amplified, corresponding to the frequency at which the loudspeaker is currently being driven as shown graphically in FIG. 5 with a small delay due to electronics. The frequency at which the microphone produces the largest output voltage is determined to be the non-radial resonant frequency which in FIG. 5 is 8860 Hz at 20° C.

The generation of approximations to sine waves over a continuous range of frequencies is described below.

Figure 6:
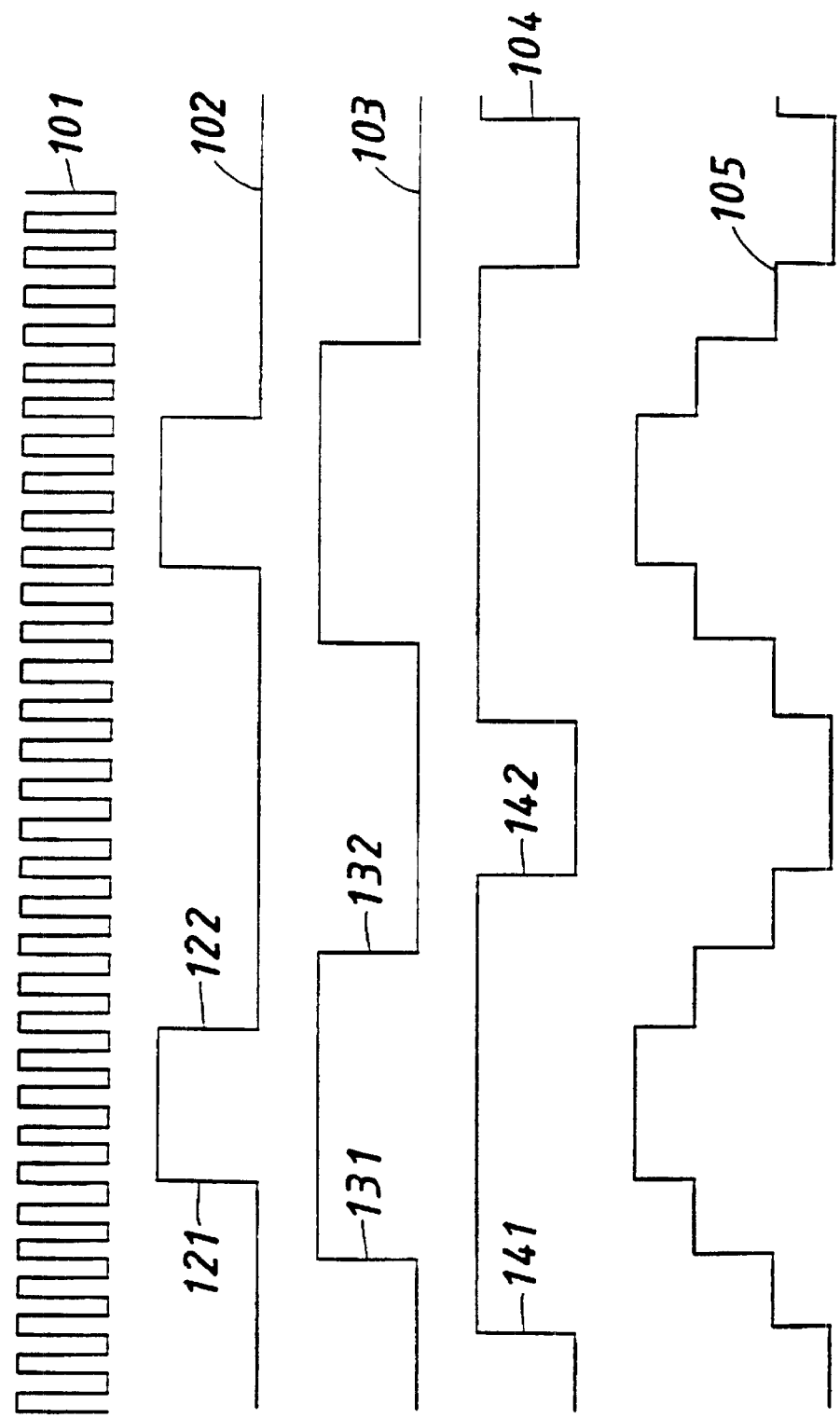
FIG. 6 illustrates how a clock signal is used to produce pulse width modulated signals which are combined to produce an approximation to a sine wave.
Figure 7:
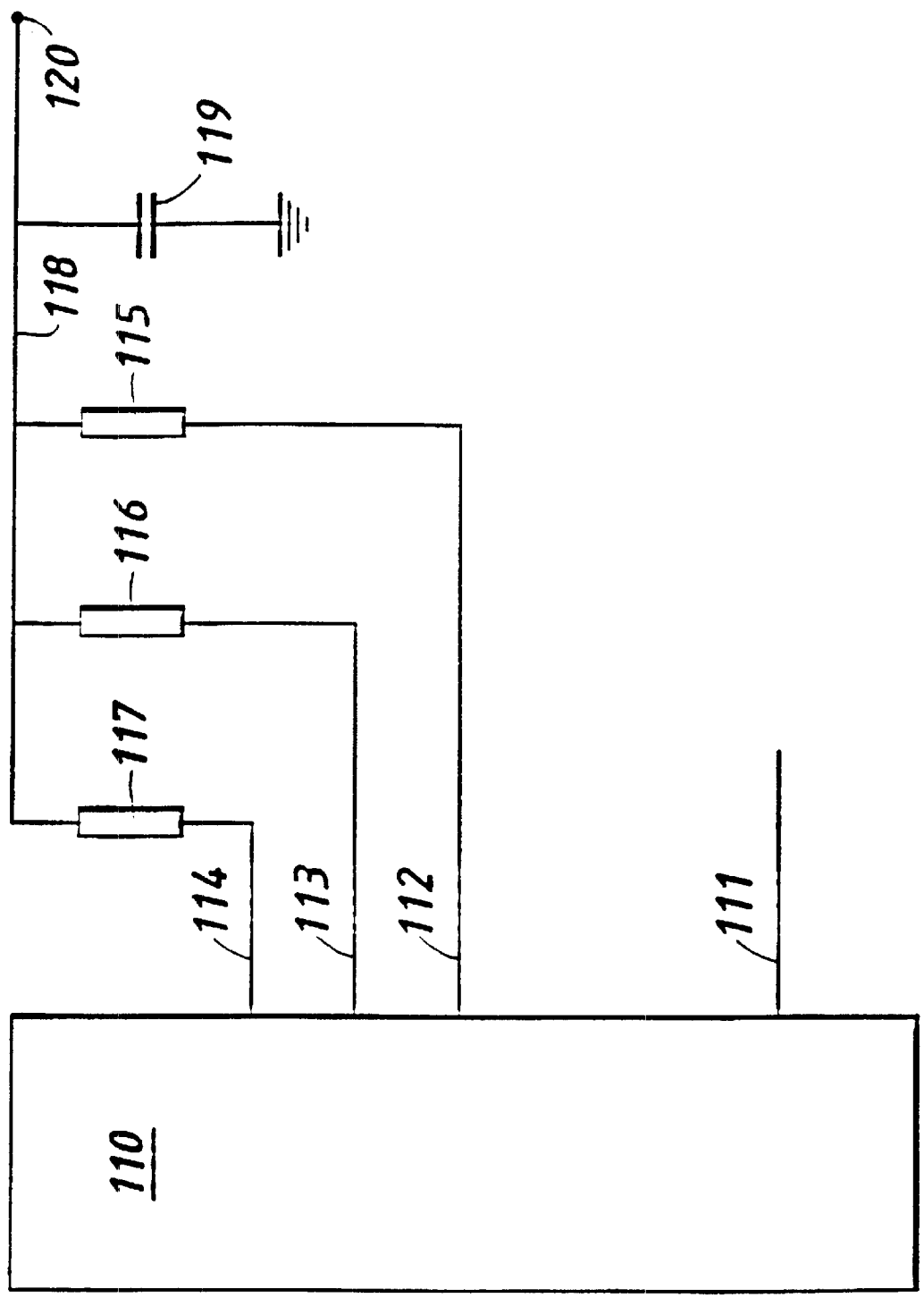
FIG. 7 shows an electronic system to perform the operation illustrated in FIG. 6.

As shown in FIGS. 6 and 7, a clock signal 101 is applied to a microprocessor 110 on line 111 from a voltage controlled oscillator. Any suitable microprocessor may be used such as a Hitachi HD6473048F16. The microprocessor 110 processes the input clock signal 101 from line 111 to produce pulse width modulated (PWM) signals 102,103 and 104 shown in FIG. 6, each of the same frequency on lines 112,113 and 114 respectively. The PWM signals 102, 103, 104 are combined together using a weighted summing arrangement, in this case consisting of resistors 115,116,117 to produce the approximation to a sine wave on line 118. The approximation to a sine wave 105 shown in FIG. 6 has the same frequency as the PWM signals 102,103,104 which each have fixed duty cycles (percentage time on to percentage time off).

In this example each cycle of the synthesised approximation to a sine wave 105 corresponds to sixteen cycles of the clock signal 101, but could be eight or thirty two or any other suitable amount. The rising 121 and falling 122 edges of PWM signal 102 are triggered by the completion of the sixth and tenth cycles of the clock signal 101 respectively. The rising 131 and falling 132 edges of PWM signal 103 are triggered by the completion of the fourth and twelfth cycles of the clock signal 101 respectively. The rising 141 and falling 142 edges of PWM signal 104 are triggered by the completion of the second and fourteenth cycles of the clock signal 101 respectively.

Each of PWM signals 102,103 and 104 is then passed through a weighting resistor 115,116,117 respectively. The ratio of the values of resistors 115,116,117 is chosen to give the best overall sine wave approximation which in this case is resistor 115 being 51 kΩ, resistor 116 being 36 KΩ and resistor 117 being 51 kΩ.

To produce an approximation to a sine wave from PWM square waves it is desirable to maintain the first harmonic whilst suppressing the third, fifth, seventh etc harmonics. Using the above method as illustrated in FIG. 6 the third and fifth harmonics are essentially removed apart from some residual effects due to resistor tolerances. In the present example it is envisaged that the sine wave generating apparatus will be used to generate sine waves in the range of 7.5 kHz–11.8 kHz to drive the loudspeaker 2 and the transmitted signal from the loudspeaker detected by the microphone 4. When used in this manner the seventh and subsequent harmonics are reduced to levels such that no further filtering or conditioning should be needed to remove the effect of these harmonics since the transmitted signal due to these harmonics should lie outside the band-pass limits of the microphone. If the apparatus is used to generate sine waves at lower frequencies, the effect of the seventh and subsequent harmonics could be removed or diminished by low pass filtering or using more pulse width modulated signals to produce a better approximation to a sine wave.

The output from each resistor 115,116,117 is combined at common line 118 to produce the approximation to a sine wave 105 shown in FIG. 6. The signal 105 is low pass filtered by capacitor 119 connected between common line 118 and earth and is detected at connection point 120.

Figure 8:
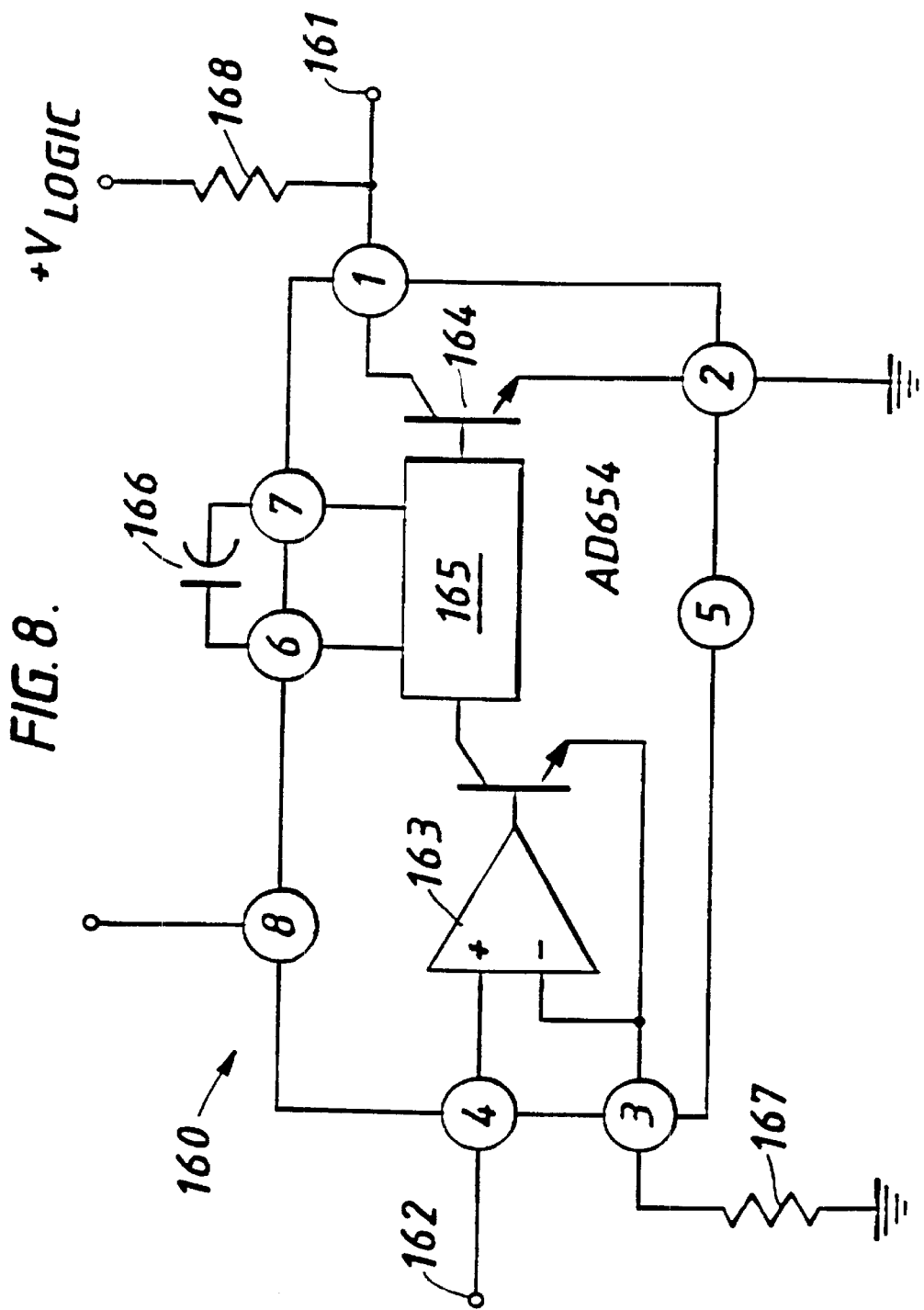
FIG. 8 shows a voltage controlled oscillator to supply the clock signal to the system shown in FIG. 6.

FIG. 8 shows a voltage controlled oscillator 160 which produces an oscillating output at 161, the frequency of which is dependent upon the voltage of a driving signal applied at input 162. However any device the output frequency of which is dependent upon the analogue value of an in put is suitable.

The present example of the invention uses an Analog Devices AD654 voltage to frequency converter. The AD654's block diagram appears in FIG. 8. A versatile operational amplifier 163 serves as the input stage; its purpose is to convert and scale the input voltage signal 162 to a drive current. A drive current is delivered to current to frequency converter 165 (an astable multivibrator). The output of converter 165 controls transistor 164.

In the connection scheme of FIG. 8, the input amplifier 163 presents a very high (250 MΩ) impedance to the input voltage at 162, which is converted into the appropriate drive current by the scaling resistor 167 at Pin 3. In this example resistors 167 and 168 are 1.2 kΩ.

The frequency of the approximation to a sine wave produced at the output connection point 120 shown in FIG. 7 cannot always be accurately assumed from the voltage of the driving signal applied at input 162 shown in FIG. 8 due to variations in temperature and the performance of electrical components for example. Consequently the microprocessor 110 may also be connected to any of lines 112,113 or 114 carrying PWM signals 102,103 and 104 respectively which are at the same frequency as the output approximation to a sine wave as described later. The microprocessor counts the number of cycles of the selected PWM signal over a given period of time such as one second. The actual output frequency of the sine wave can then be accurately determined. The microprocessor 110 counts the number of cycles of a PWM signal 102,103,104 rather than the cycles of the approximation to a sine wave 105 over a given period of time as the PWM signals have more precisely defined, clear on/off states which are easier to count providing better results.

Alternatively the microprocessor 110 could count the number of cycles of the clock signal 101 over a given period of time and from this determine the sine wave frequency by dividing by the number of clock signal cycles required to produce each PWM signal cycle.

Alternatively or additionally the microprocessor may measure the time taken to produce a predetermined number of clock cycles or PWM cycles and from this calculate the frequency of the approximation to a sine wave.

As the oscillator 160 produces an oscillating signal with a continuous range of frequencies, sine waves may be generated with a continuous range of frequencies.

Use of a variable frequency square wave generating oscillator which is a readily available, small, (9.91 mm×7.87 mm×4.57 mm in 8-pin plastic DIP form or 4.90 mm×3.91 mm×2.39 mm in 8-Pin SOIC form for the AD 654), cheap device in conjunction with a microprocessor to produce approximations to a sine wave enables the production of a device which is able to generate approximations to sine waves over a continuous range of frequencies and which is compact and so may be mounted on a compact probe for example or in a compact housing. Since a microprocessor is generally employed in many probes or electronic systems for other purposes, the only additional space that is required to produce approximations to sine waves over a continuous range of frequencies is that for the compact variable frequency square wave generating oscillator.

The oscillator need not be a voltage controlled oscillator but may be any device arranged to supply a signal with a continuous range of frequencies.

The approximation to a sine wave need not be generated from three PWM signals but could be generated from any suitable number depending upon the required level of the approximation to a sine wave. Furthermore each cycle of the sine wave need not correspond to sixteen clock cycles but could be eight, thirty two or any suitable number.

Figure 9:
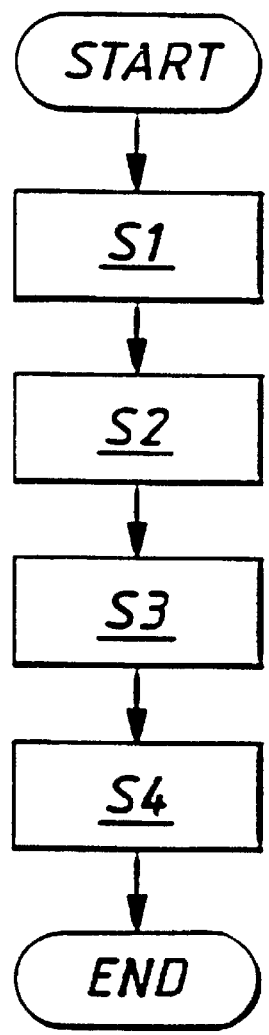
FIG. 9 shows a sequence of operations to determine the resonant frequency.

To quickly and accurately determine the resonant frequency (the frequency at which the amplitude of the signal produced by the microphone is a maximum) an initial fast, coarse frequency sweep is made (in this case 10–15 Hz steps) over the frequency range in which the resonance may occur as shown by S1 in FIG. 9. A control means such as a microprocessor identifies a narrower frequency range within the initial coarse frequency sweep in which a maximum occurs. A further frequency sweep S2 is made with smaller frequency steps (in this case 1 Hz) within this identified narrower frequency range to accurately determine the frequency at which the maximum occurs, identifying the frequency of resonance.

Using the above combination of coarse then fine frequency sweeps over a narrower frequency range, an accurate value of the resonant frequency may be quickly determined for example in a fraction of a second. A control means such as a microprocessor may average subsequent detected frequency values S3 to reduce errors due to noise. The frequency of the PWM signal may then be determined S4 to indicate the frequency of the generated sine wave driving the loudspeaker 2 at resonance.

The determination of the resonant frequency will now be explained in detail.

A microprocessor, which in this case is the microprocessor 110 described earlier which also generates the PWM signals, is used to perform an algorithm to determine the resonant frequency of the gas within the resonator. Instead of the microprocessor 110 a PC could be used with an appropriate plug-in data acquisition card.

Figure 10:
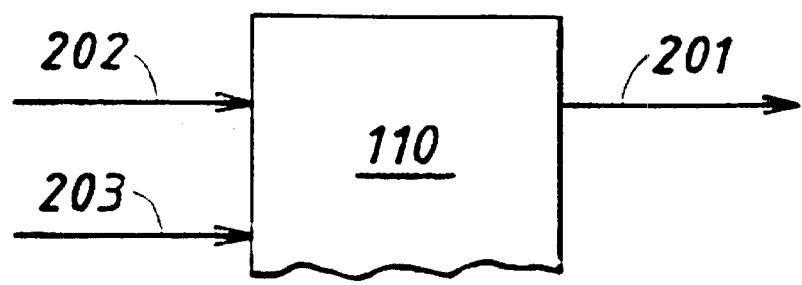
FIG. 10 shows the connections to a processing means to determine resonant frequency.

To determine the resonant frequency, as shown in FIG. 10, the microprocessor 110 has an analogue output 201, a digital input 202 and an analogue input 203.

The analogue output 201 is connected to input 162 of voltage to frequency convertor 160 shown in FIG. 8, to control the frequency applied to loudspeaker 2. In this case the analogue output 201 consists of two outputs (not shown), both of which are connected to input 162 of voltage to frequency converter 160. One ouptut controls the coarse frequency sweep and the other controls the fine frequency sweep. Each of the two outputs is passed through a digital to analogue converter, which in this case is provided in the microprocessor 110 itself, and an appropriate resistor to provide the required level of resolution. In this case the resistor for the coarse frequency control is 36 kΩ and the resistor for the fine frequency control is 2.2 MΩ.

As explained earlier, the frequency of the approximation to a sine wave signal which drives the loudspeaker cannot always be accurately assumed from the voltage of the driving signal from analogue output 201 due to temperature variations and the performance of electrical components for example. Thus one of the PWM signals 102,103,104 which are each at the same frequency as the approximation to a sine wave driving the loudspeaker 2 or the clock signal 101, is applied at digital input 202 for the microprocessor 110 to calculate the frequency of the approximation to a sine wave 105 as described earlier.

The analogue input 203 represents the amplitude of the signal being received by the microphone and is connected to microprocessor 110 via an external analogue to digital converter. The process of locating the resonant frequency is one of identifying the frequency at which the analogue input 203 is a maximum.

The process of locating the resonant frequency can be broken down into four stages. The first three stages S1, S2, S3 each involve changing the loudspeaker frequency to search for the resonance. When the resonance has been located, the final stage 54 measures the resonant frequency.

The first stage S1 is a fast scan through the permissible range of frequencies taking about one reading of the analogue input 203 for each step of the analogue output voltage 201. The permissible range of frequencies is selected to restrict the scan to those frequencies at which the non-radial resonance should occur for the expected combination of gas composition, temperature and pressure. The limits of the permissible range are imposed to reduce the time taken to locate the resonant frequency and also to reduce the risk of locating an unwanted resonant peak. Although the exact relationship between the control voltage from the analogue output 201 and the microphone frequency is not known, it can be approximated sufficiently well to be used to set the frequency limits of the permissible range within which to search for the resonance. In the present example the frequency range is 7.5 kHz to 11.8 Khz (4.3 kHz) with a frequency scan rate of 86 kHz/second and a microphone sampling rate of 100,000 samples/second producing a total of 5100 microphone samples in each direction.

To locate the resonance frequency the processor is arranged to look for a peak in the amplitude of a signal from the microphone at input 203 and then ascertain the frequency control voltage that was being used at the time.

To allow for the finite time the hardware takes to produce a change in the amplitude of the signal from the microphone at input 203 as a result of a change in the frequency control voltage at output 201, the fast scan of the first stage S1 involves a first scan up through the range of analogue output voltages 201 and a second scan down through the same range of analogue output voltages. Clearly the first scan could alternatively be down through the range of analogue output voltages and the second scan could be up through the range. When scanning up, the frequency control voltage 201 being applied when the peak is detected will be, due to the response time, slightly higher than the voltage that caused the peak to occur. When scanning down, the frequency control voltage 201 will be slightly lower than the peak voltage. Assuming that the response time is the same for both scan directions, the average of the two voltages will give the true voltage at the resonance.

Figure 11:
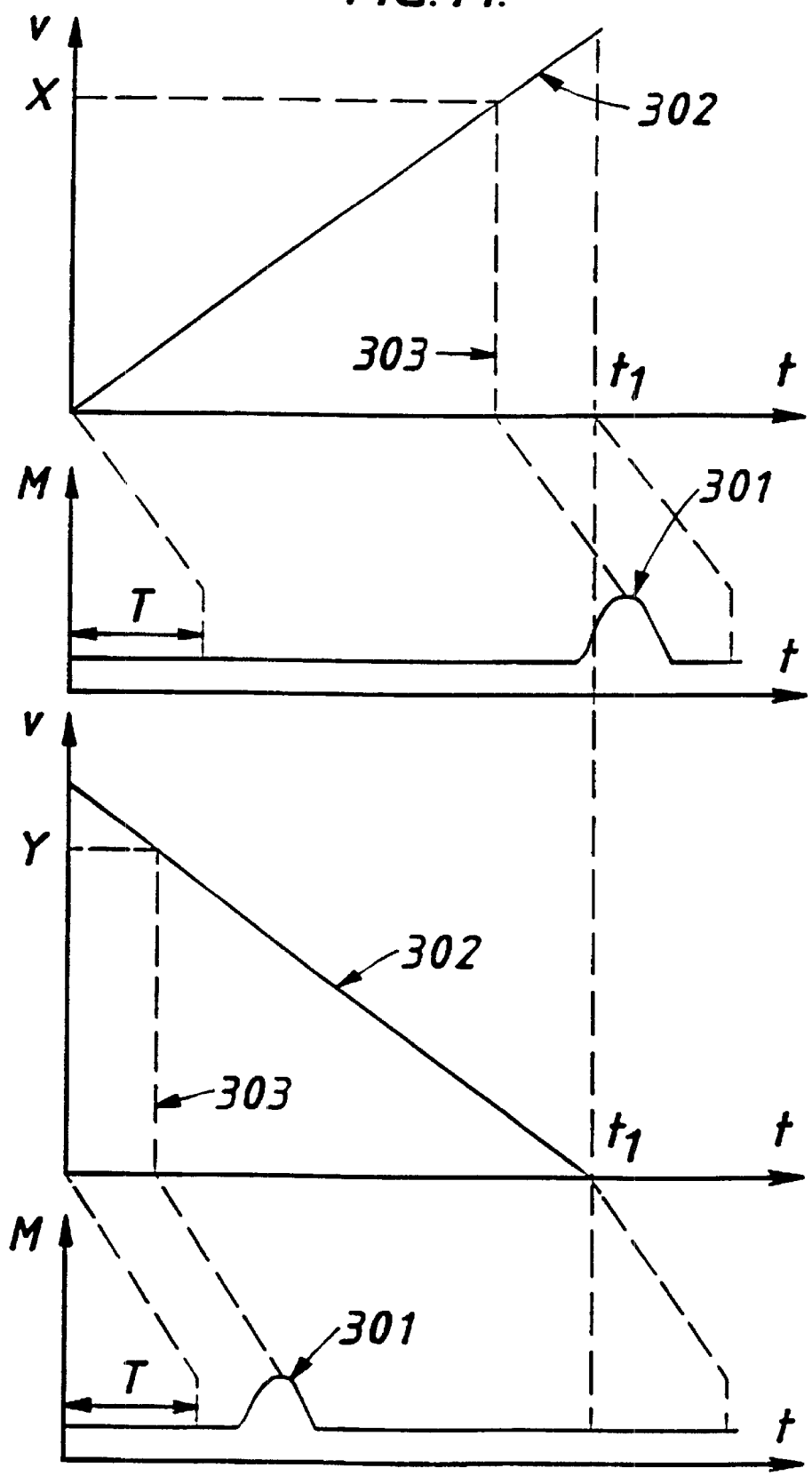
FIG. 11 shows a method of allowing for the finite hardware response time.

A second method of allowing for the finite response time of the hardware is shown in FIG. 11 in conjunction with the above method of first and second scans in opposite directions. The second method uses an estimated value for the response time T to match the peak 301 of the received microphone data values M to the frequency control voltage V which, according to the estimated response time T and the characteristic of the frequency control voltage with time 302, produced that microphone data value as shown by the broken lines 303 in FIG. 11. Consequently the microphone continues to collect data for a time after the frequency control voltage V has finished scanning at a time ti. This second method enables peaks that lie near to the end of the scan limits such as peak 301 in the upward scan of frequency control voltage 302 in FIG. 11 to be found which if the collection of microphone data M had been synchronised to the scanning of the frequency control voltage 302 would have been missed. If the estimated response time was accurate, the values X,Y found for the voltages producing the resonant peak in each of the up and down scans would be exactly the same. However, as shown in FIG. 11, the estimated value may be 3slightly inaccurate in which case the up and down values of the frequency control voltage will be slightly different and will then be averaged.

The second stage S2 uses the scanning method of the first stage except over a smaller frequency range, identified in the first stage as containing the resonant peak. The second stage uses the value for the frequency control voltage at resonance obtained by the first stage as its centerpoint for its smaller frequency scan range. In this example the frequency scan range of the second stage is 150.5 Hz.

However the result of the first scan may be too close to one of the end limits of the frequency control voltage range for the second stage to be able to use it as a centerpoint. In this case the scan of the second stage will be anchored at the appropriate end limit of the frequency control voltage range.

The frequency control voltage step size is also different for the second stage. For speed, the first stage does not use the full frequency control voltage resolution whereas the second stage does to produce a more precise resonance frequency value.

The second stage also uses a slower rate of change of loudspeaker frequency with time. In this case 2.15 kHz/second rather than 86.0 kHz/second used in the first stage. In this example the microphone sampling rate of the second stage is also lower at 25,000 samples/second producing a total of 1800 microphone samples.

The final value is obtained using the third stage S3 which uses a further scan which averages the microphone data and hence produces a dependable result. Like the second stage, this stage uses the result obtained by the preceding scan as its centerpoint. If the result of the second scan is too close to an end limit of the frequency control voltage range for the third stage S3 to be able to use it as a centerpoint, the third scan could be anchored at an appropriate end limit of its frequency control voltage range. However, the scan of this third stage is slower and more methodical than the scans of previous stages. Hence, it covers a range of fewer frequency control voltage values, generally 24 or less, and in this case 21. For each value the analogue output 201 is set and then the circuit is left to settle for a few milliseconds, in this case 5 milliseconds. When the settling time has elapsed, a given number of samples of the microphone voltage are taken, in this case 20, and summed. This process is repeated for each frequency control voltage value and the peak value ascertained. This is the resonant frequency control voltage value.

The final fourth stage S4 comprises holding the frequency at the resonant value and measuring the frequency of the signal driving the loudspeaker 2 using a PWM signal 102,103,104 or clock signal 101 supplied to the digital input 202.

What is claimed is:

1. An apparatus for synthesising an approximation to a sine wave, the apparatus comprising:

means for generating a number of pulse width modulated signals from a clock signal;

means for combining the generated pulse width modulated signals to produce an approximation to a sine wave; and wherein the clock signal is provided by an oscillator arranged to produce a variation in its output clock signal frequency in response to a variation in an analogue input controlling electrical signal for producing clock signals over a continuous range of frequencies;

including means to measure the time taken to produce a particular number of pulse width modulated signal cycles or clock signal cycles in order to calculate the approximation to a sine wave.

2. An apparatus according to claim 1, wherein said means for generating a number of pulse width modulated signals is a microprocessor.

3. An apparatus according to claim 1, including a loudspeaker arranged to be driven by the approximation to a sine wave.

4. An apparatus according to claim 1 wherein the means for combining the generated pulse width modulated signals is a weighted summing arrangement.

5. An apparatus according to claim 1, wherein the approximation to a sine wave is arranged to be passed through a low pass filter.

6. An apparatus according to claim 1, including a counting means for counting the cycles of said number of pulse width modulated signals or said clock signal over a particular period of time in order to calculate the frequency of the approximation to a sine wave.

7. A method of synthesising an approximation to a sine wave, the method comprising:

generating a number of pulse width modulated signals from a clock signal;

combining said generated pulse width modulated signals to produce an approximation to a sine wave; and wherein the clock signal is provided by an oscillator arranged to produce a variation in its output clock signal frequency as a result of a variation in an analogue input controlling electrical signal to produce clock signals over a continuous range of frequencies; and wherein the frequency of said approximation to a sine wave is determined by measuring the time taken to produce a predetermined number of pulse width modulated signal cycles or clock cycles.

8. A method according to claim 7, wherein the pulse width modulated signals are combined using a weighted summing arrangement.

9. A method according to claim 7, wherein the approximation to a sine wave is low pass filtered.

10. A method according to claim 7, wherein the frequency of said approximation to a sine wave is determined by counting the number of cycles of one of the pulse width modulated signals or the clock signal produced over a particular period of time.

11. A method according to claim 7, wherein the pulse width modulated signals are generated by a microprocessor.

12. A method according to claim 7, wherein the approximation to a sine wave is arranged to drive a loudspeaker.

* * * * *